(12) United States Patent
Ito et al.

(10) Patent No.: US 11,121,099 B2
(45) Date of Patent: Sep. 14, 2021

(54) SEMICONDUCTOR DEVICE

(71) Applicant: Mitsubishi Electric Corporation, Tokyo (JP)

(72) Inventors: Masayasu Ito, Tokyo (JP); Katsumi Miyawaki, Tokyo (JP); Hiroaki Ichinohe, Tokyo (JP); Takashi Tsurumaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 112 days.

(21) Appl. No.: 16/462,103

(22) PCT Filed: Dec. 29, 2016

(86) PCT No.: PCT/JP2016/089209
§ 371 (c)(1),
(2) Date: May 17, 2019

(87) PCT Pub. No.: WO2018/123064
PCT Pub. Date: Jul. 5, 2018

(65) Prior Publication Data
US 2020/0273825 A1 Aug. 27, 2020

(51) Int. Cl.
*H01L 23/66* (2006.01)
*H01L 23/12* (2006.01)
(Continued)

(52) U.S. Cl.
CPC .............. *H01L 23/66* (2013.01); *H01L 23/12* (2013.01); *H01L 23/3677* (2013.01);
(Continued)

(58) Field of Classification Search
CPC ..................................................... H01L 23/66
See application file for complete search history.

(56) References Cited

U.S. PATENT DOCUMENTS 4,985,753 A * 1/1991 Fujioka ................. H01L 23/057
257/700
5,075,645 A 12/1991 Eda et al.
(Continued)

FOREIGN PATENT DOCUMENTS

DE 10 2009 045 063 A1 3/2011
JP H03-066205 A 3/1991
(Continued)

OTHER PUBLICATIONS

International Search Report; Written Opinion; and Notification of Transmittal of the International Search Report and the Written Opinion of the International Searching Authority, or the Declaration issued in PCT/JP2016/089209; dated Mar. 28, 2017.
(Continued)

*Primary Examiner* — William A Harriston
(74) *Attorney, Agent, or Firm* — Studebaker & Brackett PC

(57) ABSTRACT

A semiconductor device includes a heat sink, an integrated component in which a ceramic terminal having a microstrip line and a matching circuit are integrated into one unit, a lead fixed to the ceramic terminal, a matching substrate fixed to the heat sink, a semiconductor chip fixed to the heat sink, a plurality of wires configured to connect the matching circuit and the matching substrate and to connect electrically the matching substrate and the semiconductor chip, a frame configured to surround the matching substrate and the semiconductor chip in a plan view, and a cap provided on the frame.

5 Claims, 10 Drawing Sheets

(51) Int. Cl.
  *H01L 23/367* (2006.01)
  *H01L 23/488* (2006.01)
  *H03F 3/19* (2006.01)
  *H03F 3/21* (2006.01)

(52) U.S. Cl.
  CPC .............. *H01L 23/488* (2013.01); *H03F 3/19* (2013.01); *H03F 3/21* (2013.01)

(56) References Cited

U.S. PATENT DOCUMENTS

| | | |
|---|---|---|
| 5,455,386 A | 10/1995 | Brathwaite et al. |
| 2002/0186091 A1 | 12/2002 | Maeda et al. |
| 2010/0109165 A1 | 5/2010 | Kashiwabara |
| 2010/0237486 A1 | 9/2010 | Kashiwabara |
| 2015/0115451 A1 | 4/2015 | Viswanathan |
| 2016/0065145 A1* | 3/2016 | Nakashima ....... H01L 23/49844 330/289 |

FOREIGN PATENT DOCUMENTS

| | | |
|---|---|---|
| JP | H06-275736 A | 9/1994 |
| JP | H09-507614 A | 7/1997 |
| JP | 2002-335136 A | 11/2002 |
| JP | 2003-249581 A | 9/2003 |
| JP | 2010-135722 A | 6/2010 |
| JP | 2012-186346 A | 9/2012 |
| JP | 2015-002206 A | 1/2015 |
| JP | 2015-015513 A | 1/2015 |
| JP | 2015-088757 A | 5/2015 |

OTHER PUBLICATIONS

Office Action issued in JP 2017-522217; mailed by the Japanese Patent Office dated Aug. 1, 2017.
An Office Action issued by the German Patent Office dated Jul. 21, 2020, which corresponds to German Patent Application No. 11 2016 007 562.6 and is related to U.S. Appl. No. 16/462,103.

* cited by examiner

SEMICONDUCTOR DEVICE

FIELD

The present invention relates to, for example, a semiconductor device for use in a high-power amplifier used in a driver stage of a mobile phone base station.

BACKGROUND

A package functioning as a power amplifier is generally fabricated as follows. Firstly, a ceramic terminal configured to transmit an electric signal is fixed on to a copper alloy heat sink with a silver wax material. Following this, a ceramic frame constituting a wall is placed on the heat sink and the ceramic terminal, and the heat sink and the ceramic frame are fixed together with a silver wax material. A lead is fixed on to the ceramic terminal with the same silver wax material.

Following this, a semiconductor chip is fixed on to the heat sink within the ceramic frame with a gold-tin eutectic solder. Next, a matching substrate for realizing a terminal resistance of 50Ω is fixed to the heat sink between the semiconductor chip and the ceramic terminal with a gold-tin eutectic solder. Following this, not only the semiconductor chip and the matching substrate, but also the matching substrate and the ceramic terminal are connected together with a gold wire. Further, a ceramic cap configured to protect an interior circuit from an external force is fixed to the ceramic frame with a gold-tin eutectic solder. Thus, a semiconductor device is completed into which an electric signal is inputted from an exterior portion and which outputs an electric signal to an exterior portion.

In this type of semiconductor device, an electric signal is transmitted from one of the leads through the ceramic terminal, the wire, the matching circuit and the wire and is inputted into the semiconductor chip to amplify the high-frequency signal. Then, the amplified high-frequency signal is transmitted towards the other lead sequentially through the wire, the matching circuit, the wire, and the ceramic terminal in that order and is then outputted from the other lead. The interior circuit is protected against an external force applied from an exterior portion and a foreign matter entering from an external region by the ceramic frame, the ceramic cap and the heat sink. This type of semiconductor device is disclosed in, for example, Patent Literature 1.

PRIOR ART

Patent Literature

Patent Literature 1: JP2010-135722A

SUMMARY

Technical Problem

For the semiconductor device making up the package functioning as the power amplifier, a reduction in cost and an enhancement in performance are required by reducing the number of parts, enhancing the facility with which the semiconductor device is assembled, or using other methods.

The present invention has been made to solve the problem described above, and an object thereof is to provide a semiconductor device that can reduce the costs and enhance the performance thereof.

Means for Solving the Problems

According to the present invention, a semiconductor device includes a heat sink, an integrated component in which a ceramic terminal having a microstrip line and a matching circuit are integrated into one unit, a lead fixed to the ceramic terminal, a matching substrate fixed to the heat sink, a semiconductor chip fixed to the heat sink, a plurality of wires configured to connect the matching circuit and the matching substrate and to connect electrically the matching substrate and the semiconductor chip, a frame configured to surround the matching substrate and the semiconductor chip in a plan view, and a cap provided on the frame.

According to another aspect of the present invention, a semiconductor device includes a heat sink having a quadrangular shape in a plan view and having a first portion of an H shape in a plan view and a second portion formed thinner than the first portion, a substrate having a microstrip line and fixed to the second portion with a solder, a lead fixed to the substrate, a matching substrate fixed to the second portion, a semiconductor chip fixed to the first portion, a plurality of wires configured to connect the substrate and the matching substrate and to connect electrically the matching substrate and the semiconductor chip, and a frame whose bottom surface is fixed to the substrate and the first portion and configured to surround the semiconductor chip, wherein an upper surface of the substrate and an upper surface of the first portion are equal in height, and wherein the bottom surface of the frame constitutes a flat surface.

According to another aspect of the present invention, a semiconductor device includes a heat sink, an outer matching substrate having an outer frame portion provided on the heat sink, whose upper surface is flat, and having an annular shape in a plan view and an inner portion provided on the heat sink, staying in contact with an inner wall of the outer frame portion and formed thinner than the outer frame portion, a through hole being provided in the inner portion, a lead fixed to the outer frame portion, a matching substrate fixed to the heat sink exposed by the through hole, a semiconductor chip fixed to the heat sink exposed by the through hole, a plurality of wires configured to connect the inner portion and the matching substrate and to connect electrically the matching substrate and the semiconductor chip, an outer matching substrate wire configured to connect the outer frame portion and the inner portion, and a cap fixed to an upper surface of the outer frame portion.

According to another aspect of the present invention, a semiconductor device includes a heat sink, a lead fixed to the heat sink, an outer matching substrate fixed to the heat sink, a matching substrate fixed to the heat sink, a semiconductor chip fixed to the heat sink, an annular frame portion fixed to an upper surface of the lead with an insulating adhesive, a cover having a cap portion fixed to an upper surface of the frame portion, and a plurality of wires configured to connect the outer matching substrate and the matching substrate and to connect electrically the matching substrate and the semiconductor chip, wherein the lead and the outer matching substrate are electrically connected.

Other features of the present invention will become apparent from the following description.

Advantageous Effects of Invention

According to the present invention, the semiconductor device can be provided which can reduce the costs and enhance the performance thereof, for example, by integrating the ceramic terminal having the microstrip line with the matching circuit.

DESCRIPTION OF EMBODIMENTS

Semiconductor devices according to embodiments of the present invention will be described by reference to drawings. Like reference signs will be given to like or corresponding constituent elements to omit the repetition of similar descriptions from time to time.

Embodiment 1

Figure 1:
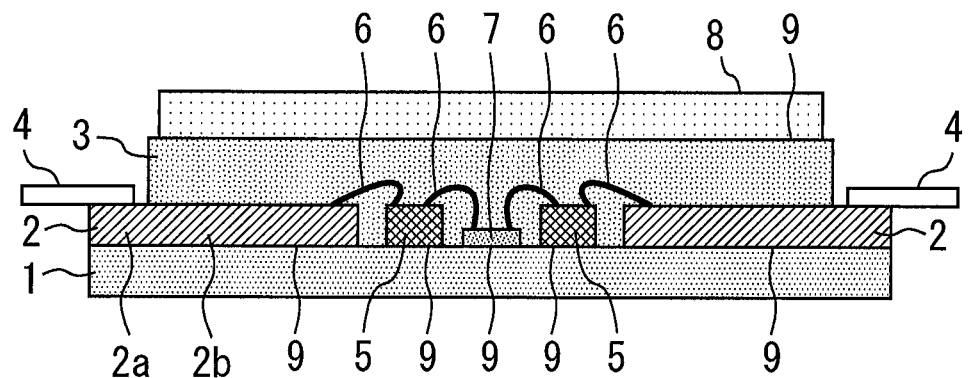
FIG. 1 is a sectional view of a semiconductor device according to Embodiment 1.

FIG. 1 is a sectional view of a semiconductor device according to Embodiment 1 of the present invention. This semiconductor device includes a heat sink 1. Integrated components 2, matching substrates 5 and semiconductor chips 7 are fixed to the heat sink 1. The integrated component 2 is such that a ceramic terminal 2a having a microstrip line is integrated with a matching circuit 2b. The matching circuit 2b is an input and output matching circuit. The integrated component 2 includes a ceramic substrate, a metallic film formed on a whole surface of a lower surface of the ceramic substrate, and a metallic pattern formed on an upper surface of the ceramic substrate.

The matching substrate 5 includes a ceramic substrate, a metallic film formed on a lower surface of the ceramic substrate, and a metallic film formed on an upper surface of the ceramic substrate. A circuit may be formed by a metallic pattern on the upper surface of the ceramic substrate. Although the integrated component 2 and the matching substrate 5 both have the ceramic substrate, the ceramic substrate of the integrated component 2 and the ceramic substrate of the matching substrate 5 may be formed of different materials to realize an impedance matching. For example, alumina, aluminum nitride, or the like can be selected as a material for the ceramic substrate.

The semiconductor chip 7 is an FET chip that amplifies power. Two matching substrates 5 are disposed individually on left and right sides of the semiconductor chip 7. Two integrated components 2 are disposed individually on left and right sides of the semiconductor chip 7 and the two matching substrates 5. The semiconductor chip 7, the matching substrates 5 and the integrated components 2 are joined to the heat sink 1 using a gold-tin eutectic solder 9 having a fusion point of 280° C., for example.

The lead 4 is fixed to the ceramic terminal 2a with, for example, a gold-tin eutectic solder. The lead 4 is used to transmit and receive electric signals to and from an exterior portion. A frame 3, which is configured to prevent foreign matters from entering from an exterior portion, is provided on the integrated components 2 and the heat sink 1. The frame 3 surrounds the matching substrates 5 and the semiconductor chips 7 when viewed from above. A cap 8 is fixed to an upper surface of the frame 3, with, for example, a gold-tin eutectic solder. This produces a tightly closed space that is surrounded by the frame 3, the cap 8 and the heat sink 1. Wires 6 connecting the matching circuits 2b and the matching substrates 5 and wires 6 connecting the matching substrates 5 and the semiconductor chips 7 are provided in this tightly closed space. A high-frequency signal is transmitted to these wires 6.

A flow of a high-frequency signal will briefly be described. A high-frequency signal that enters the left-side lead 4 from an exterior portion is transmitted through the metallic pattern on the integrated component 2 and the matching substrate 5 by way of the wire 6, arrives at the semiconductor chip 7, and is amplified by the semiconductor chip 7. The amplified high-frequency signal is transmitted through the matching substrate 5 and the integrated component 2 by way of the wires 6 on the right side of the semiconductor chip 7, arrives at the right-side lead 4, and is outputted to an exterior portion. Since an impedance matching is realized by the input-side matching circuit 2b and matching substrate 5 and an impedance matching is realized by the output-side matching circuit 2b and matching substrate 5, the power on the output side can be maximized.

Figure 2:
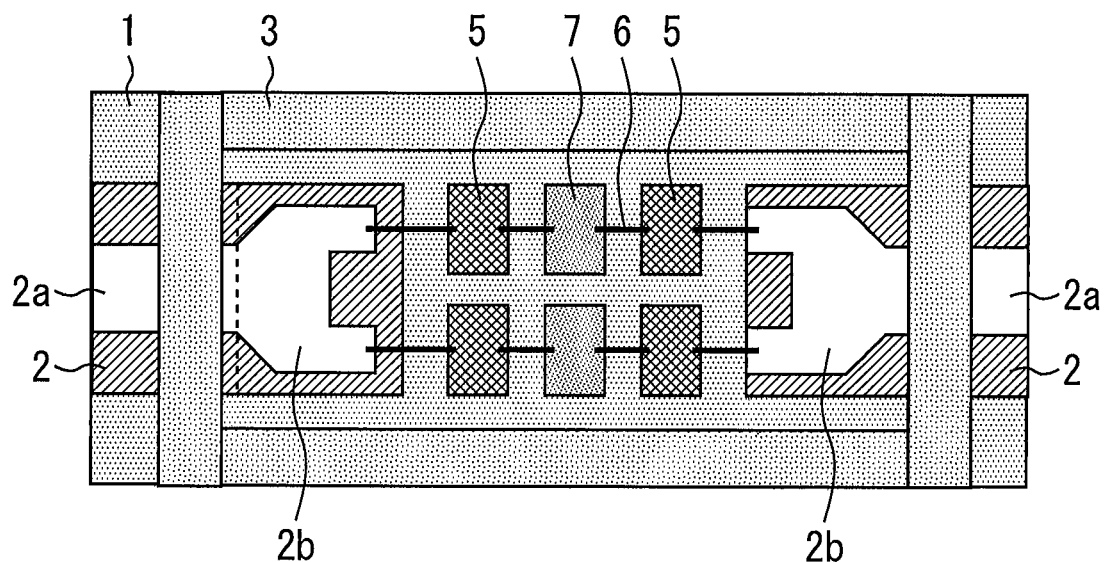
FIG. 2 is a plan view of the semiconductor device.

FIG. 2 is a plan view of the semiconductor device according to Embodiment 1. In FIG. 2, the cap 8 is omitted for the sake of disclosing an internal structure of the semiconductor device. One integrated component 2 is provided on each of the left and right of the semiconductor device. Two semiconductor chips 7 are provided. The semiconductor chips 7 are each held by two matching substrates 5. Due to this, four matching substrates 5 are provided. The two integrated components 2 exist to be located individually on the left and right of the four matching substrates 5 and the two semiconductor chips 7.

The two integrated components 2 have the same structure. In relation to the left-side integrated component 2, a portion on a left side of a broken line constitutes a ceramic terminal 2a, and a portion on a right side of the broken line constitutes a matching circuit 2b. A rectilinear metallic pattern is formed on an upper surface of the ceramic terminal 2a. A metallic pattern configured to realize an impedance matching is formed on an upper surface of the matching circuit 2b. The frame 3 has a quadrangular shape in a plan view to surround the matching substrates 5 and the semiconductor chips 7 in a plan view. The frame 3 is in contact with upper surfaces of the integrated components 2 and an upper surface of the heat sink 1.

Since the semiconductor device according to Embodiment 1 of the present invention has the configuration described above, the semiconductor device constitutes a package functioning as a power amplifier. In a conventional package functioning as a power amplifier, a ceramic terminal to which a lead is fixed and a matching circuit are separate components. When mounting the ceramic terminal and the matching circuit separately, there may occur a situation where a distance between the ceramic terminal and the matching circuit deviates of the order of ±100 μm from an ideal distance. A wire configured to control the impedance becomes necessary to realize an impedance matching that takes this deviation into consideration. That is, the positional deviation of either of the matching substrate and the ceramic terminal causes a necessity of providing a matching on a mounting substrate to achieve a terminal resistance of 50Ω by a wire, causing a problem in that the working time becomes long.

In contrast with this, in the semiconductor device according to Embodiment 1 of the present invention, since the integrated component 2 is provided in which the ceramic terminal 2a having a microstrip line is integrated with the matching circuit 2b, no mounting deviation is generated between the ceramic terminal 2a and the matching circuit 2b. No wire is required which realizes an impedance matching taking the mounting deviation into consideration. Thus, the number of wires can be reduced. Additionally, since the solder 9 is provided which uses as a material thereof the gold-tin eutectic solder which is more inexpensive than an Au-based wire, using the gold-tin eutectic solder is preferable to reduce the production costs.

In the semiconductor device according to Embodiment 1, one matching substrate 5 is provided on one transmission line on the input side, and one matching substrate 5 is provided on one transmission line on the output side. However, a plurality of matching substrates 5 may be provided on one transmission line on the input side, and a plurality of matching substrates 5 may be provided on one transmission line on the output side. The number of matching substrates 5 is controlled to realize an impedance matching. For example, in FIG. 1, two matching substrates 5 may be provided between the integrated component 2 and the semiconductor chip 7. As this occurs, there are provided a plurality of wires 6 connecting electrically the matching substrates 5 and the semiconductor chip 7. The modified example described in Embodiment 1 can also be applied to semiconductor devices according to the following embodiments. Since the semiconductor devices according to the following embodiments have many common features to those of the semiconductor device according to Embodiment 1, different features from those of Embodiment 1 will mainly be described.

Embodiment 2

Figure 3:
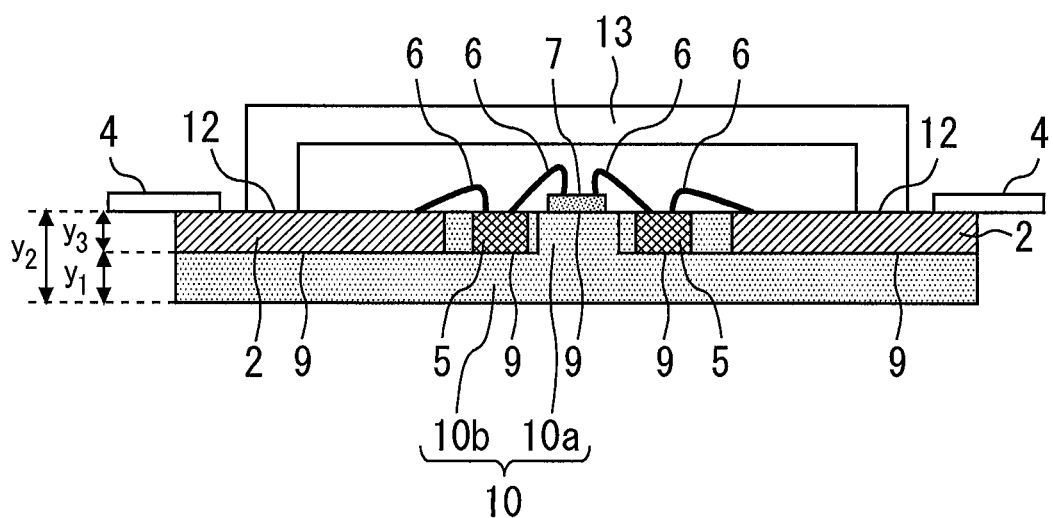
FIG. 3 is a sectional view of a semiconductor device according to Embodiment 2.

FIG. 3 is a sectional view of a semiconductor device according to Embodiment 2. A heat sink 10 includes a first portion 10a and second portions 10b which are formed thinner than the first portion 10a. In FIG. 3, the first portion 10a is positioned centrally, and the second portions 10b are positioned individually on the left and right of the first portion 10a. Semiconductor chips 7 are fixed to the first portion 10a with solders 9. Matching substrates 5 are fixed individually to the corresponding second portions 10b with solders 9, and integrated components 2 are fixed individually to the corresponding second portions 10b with different solders 9. Leads 4 are fixed individually to the corresponding integrated components 2. The integrated components 2 and the matching substrates 5 are connected by a plurality of wires 6, whereby the matching substrates 5 and the semiconductor chips 7 are connected electrically.

A thickness of the second portion 10b is y1. A thickness of the first portion 10a is y2. A difference in thickness between the first portion 10a and the second portion 10b is y3. A thickness of the integrated component 2 is y3. Thus, an upper surface of the integrated component 2 is equal in height to an upper surface of the first portion 10a.

A frame 13 constitutes a cover having a cavity provided therein. For example, a bottom surface of the frame 13 is fixed to the integrated components 2 and the first portion 10a with, for example, an adhesive. In FIG. 3, fixing the bottom surface of the frame 13 to the integrated components 2 is disclosed, but fixing the bottom surface of the frame 13 to the first portion 10a is not disclosed.

Figure 4:
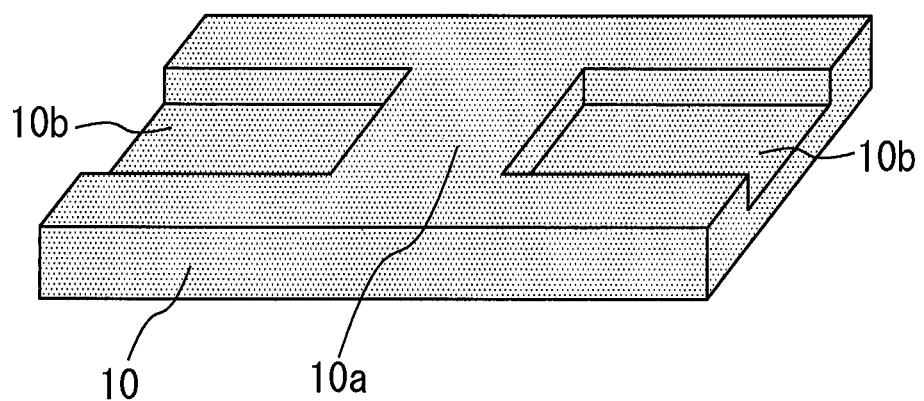
FIG. 4 is a perspective view of the heat sink.

FIG. 4 is a perspective view of the heat sink 10. The heat sink 10 has a quadrangular shape in a plan view. The first portion 10a has an H shape in a plan view. The second portions 10b are thinner than the first portion to thereby form depressions.

Figure 5:
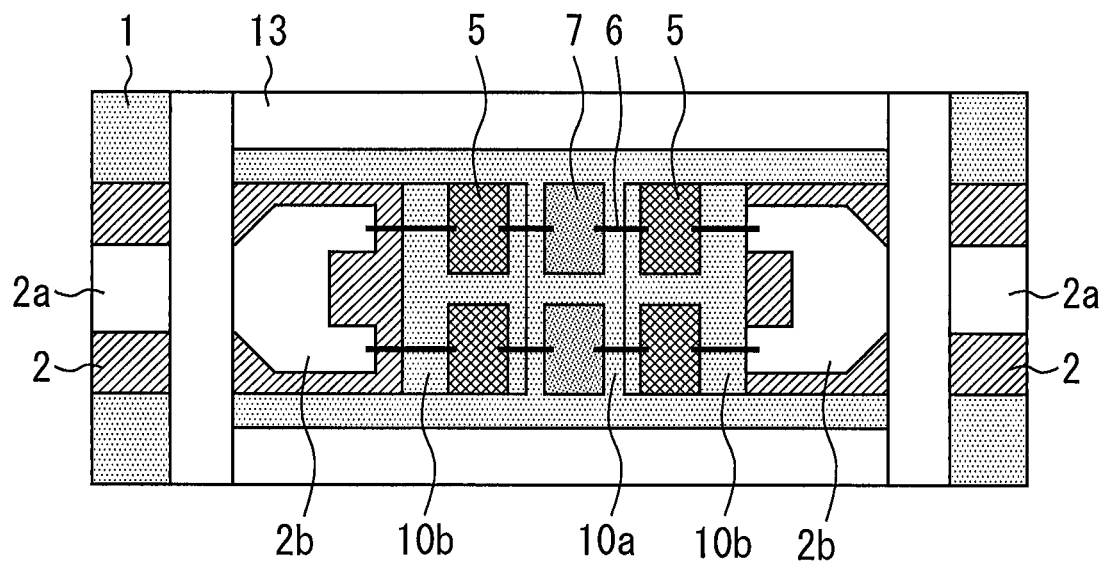
FIG. 5 is a plan view of the semiconductor device.

FIG. 5 is a plan view of the semiconductor device. The semiconductor chips 7 are mounted at a central portion of the first portion 10a. The frame 13 surrounds the semiconductor chips 7 and the matching substrates 5. The frame 13 is provided on the integrated components 2 and the first portion 10a. Since the upper surfaces of the integrated components 2 and the upper surface of the first portion 10a are equal in height, a bottom surface of the frame 13 can be made into a flat surface. The frame 13 is shaped to surround the semiconductor chips. Since the frame 13 includes a lid portion, no cap is necessary.

In Embodiment 2 of the present invention, since the semiconductor chips 7 are fixed to the first portion 10a which is formed thick, the solders applied to the second portions 10b which are one step lower than the first portion 10a hardly arrive at the semiconductor chips 7. That is, since the solders 9 applied to the second portions 10b have to climb up steps between the first portion 10a and the second portions 10b to arrive at the semiconductor chips 7, the solders hardly arrive at the semiconductor chips 7. Thus, an electric short-circuit of the semiconductor chips 7 by the solders can be suppressed.

Further, since the upper surfaces of the integrated components 2 and the upper surface of the first portion 10a are made equal in height, the bottom surface of the frame 13 can be formed into the flat surface. Thus, when compared with a case where a frame is fabricated whose bottom surface has a complex shape, the frame 13 can be fabricated easily.

The integrated component 2 can be replaced with a substrate having a different configuration from that of the integrated component 2. There is imposed no limitation to such a substrate as long as the substrate has a microstrip line to connect the lead 4 and is configured to be fixed to the second portion 10b with a solder. This embodiment adopts, as such a substrate, the integrated component 2 in which the ceramic terminal having a microstrip line and the matching circuit are integrated into one unit.

Figure 6:
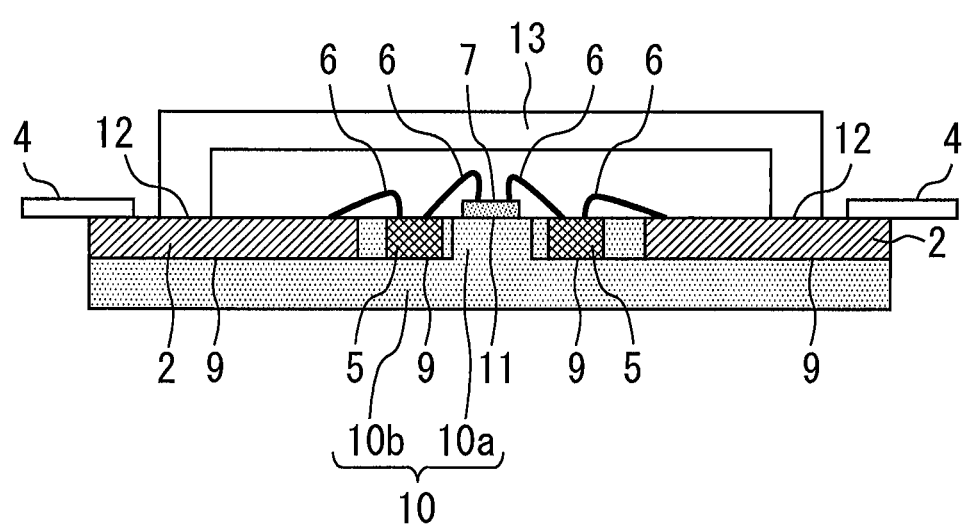
FIG. 6 is a sectional view of a semiconductor device according to a modified example.

FIG. 6 is a sectional view of a semiconductor device according to a modified example. A semiconductor chip 7 is fixed to a first portion 10 with a silver sintered material 11. The silver sintered material 11 is formed by sintering nanometer silver particles. An integrated component 2 and a matching substrate 5 are fixed to a second portion 10b with solders 9 such as a gold-tin eutectic solder. In this semiconductor device, the semiconductor chip 7 is mounted with the silver sintered material 11 having a fusion point of 962° C., and the integrated component 2 and the matching substrate 5 are mounted with a solder 9 having a fusion point of 280° C. By doing so, the silver sintered material 11 can be prevented from being fused again when mounting the integrated component 2 and the matching substrate 5.

Embodiment 3

Figure 7:
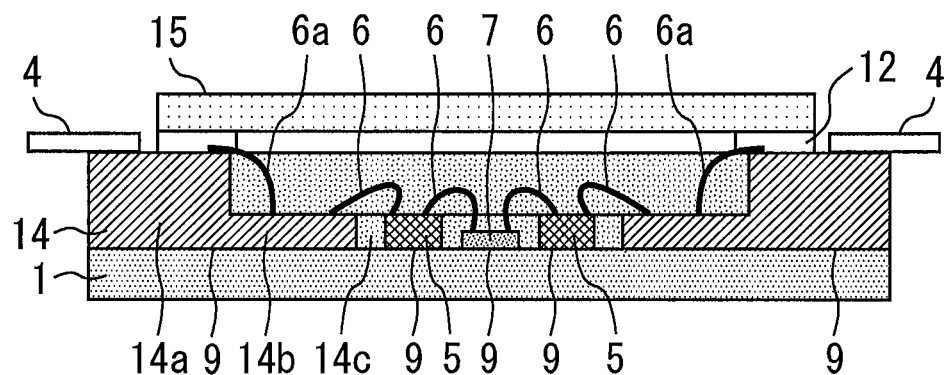
FIG. 7 is a sectional view of a semiconductor device according to Embodiment 3.

FIG. 7 is a sectional view of a semiconductor device according to Embodiment 3. An outer matching substrate 14, a matching substrate 5, and a semiconductor chip 7 are fixed to a heat sink 1 with, for example, solders 9. The outer matching substrate 14 includes an outer frame portion 14a and an inner portion 14b which continues to the outer frame portion 14a. A through hole 14c is provided in the inner portion 14b. The matching substrate 5 and the semiconductor chip 7 are fixed to the heat sink 1 which is exposed by this through hole 14c.

A lead 4 is fixed to the outer frame portion 14a with a solder. The outer matching substrate 14, the matching substrate 5 and the semiconductor chip 7 are fixed to the heat sink 1, and thereafter, the lead 4 is fixed to the outer frame portion 14a. A cap 15 is fixed to an upper surface of the outer frame portion 14a with an insulating adhesive 12. The cap 15 is fixed to the outer frame portion 14a after the lead 4 is fixed to the outer frame portion 14a. The cap 15 is a ceramic having a flat plate shape, for example. The inner portion 14b and the matching substrate 5 are connected and the matching substrate 5 and the semiconductor chip 7 are electrically connected by a plurality of wires 6. The outer frame portion 14a and the inner portion 14b are connected by an outer matching substrate wire 6a.

Figure 8:
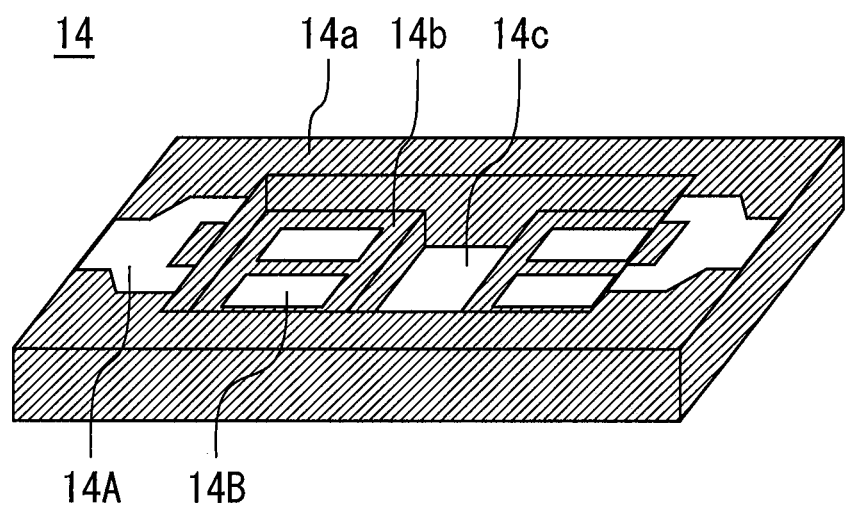
FIG. 8 is a perspective view of the outer matching substrate.

FIG. 8 is a perspective view of the outer matching substrate 14. The outer matching substrate 14 includes a substrate formed of ceramic, a metallic film formed on a lower surface of the substrate, and metallic patterns 14A, 14B which are formed on an upper surface of the substrate. The outer frame portion 14a has an annular shape in a plan view. The outer frame portion 14a constitutes a side wall of the semiconductor device. An upper surface of the outer frame portion 14a is flat.

The inner portion 14b comes into contact with an inner wall of the outer frame portion 14a and is formed thinner than the outer frame portion 14a. This provides a step between the outer frame portion 14a and the inner portion 14b. The metallic pattern 14A is formed on the upper surface of the outer frame portion 14a. The metallic pattern 14A includes a rectilinear microstrip line and a matching circuit pattern. The metallic pattern 14B is formed on an upper surface of the inner portion 14b. The metallic pattern 14B constitutes a microstrip line.

Figure 9:
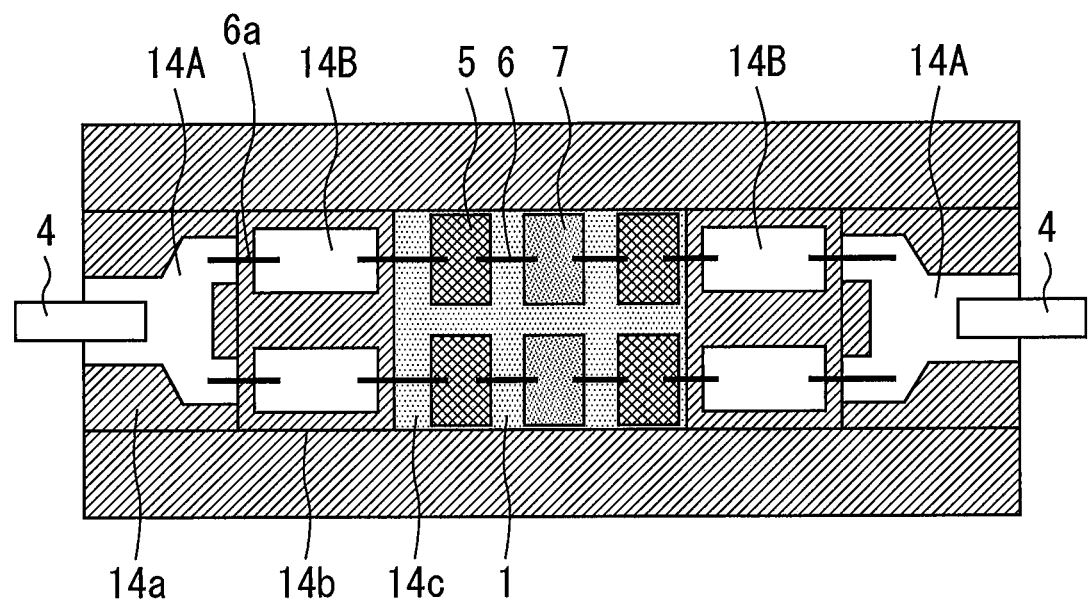
FIG. 9 is a plan view of the semiconductor device.

FIG. 9 is a plan view of the semiconductor device illustrated in FIG. 7. The cap 15 is omitted. The outer frame portion 14a of the outer matching substrate 14 surrounds the matching substrates 5 and the semiconductor chips 7 in a plan view. The outer frame portion 14a has the functions of the integrated component 2 and the frame 3 of Embodiment 1. The cap 15 can be fixed directly to the outer frame portion 14a whose upper face is flat without any gap. Since the upper surface of the outer frame portion 14a is flat, the flat plate-shaped cap 15 can be made use of. Moreover, no frame is required.

Since the matching substrate 5 and the semiconductor chip 7 are fixed to the heat sink 1 which is exposed in the through hole 14c in the outer matching substrate 14, a positional deviation of the matching substrate 5 and the semiconductor chip 7 relative to the outer matching substrate 14 can be prevented.

Figure 10:
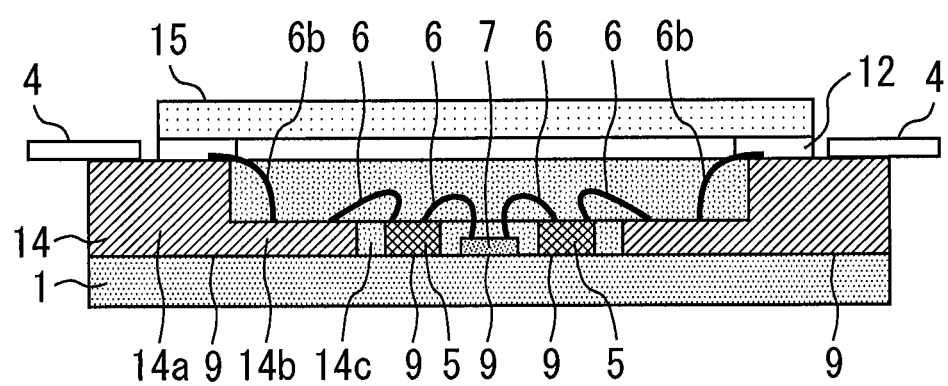
FIG. 10 is a sectional view of a semiconductor device according to a modified example.

FIG. 10 is a sectional view of a semiconductor device according to a modified example. An outer matching substrate wire 6b is formed of a gold ribbon. A variation in height of outer matching substrate wires can be reduced by forming all outer matching substrate wires of gold ribbons. The high frequency characteristics of the semiconductor device can be stabilized by suppressing the variation in height of the wires.

Figure 11:
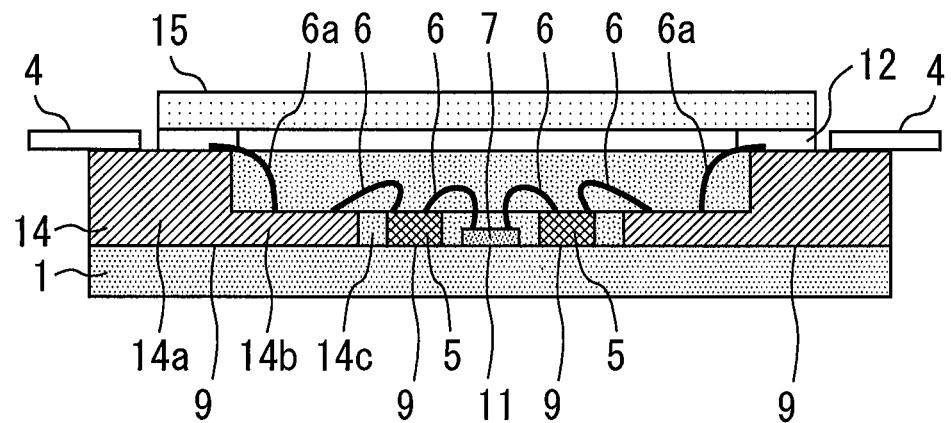
FIG. 11 is a sectional view of a semiconductor device according to another modified example.

FIG. 11 is a sectional view of a semiconductor device according to another modified example. A semiconductor chip 7 is fixed to a heat sink 1 with a silver sintered material, and an outer matching substrate 14 and a matching substrate 5 are fixed to the heat sink 1 with solders 9 using a gold-tin eutectic solder for its material. The outer matching substrate 14 and the matching substrate 5 are mounted with the solders 9 having a fusion point of 280° C. after the semiconductor chip 7 is mounted with the silver sintered material 11 having a fusion point of 962° C., whereby the silver sintered material 11 can be prevented from being fused again when the outer matching substrate 14 and the matching substrate 5 are mounted.

The joining materials may be unified in type by mounting the semiconductor chip 7, the outer matching substrate 14, and the matching substrate 5 on the heat sink 1 with the solder 9 or mounting the semiconductor chip 7, the outer matching substrate 14 and the matching substrate 5 on the heat sink 1 with the silver sintered material 11. Unifying the joining materials can facilitate the assembling work.

Embodiment 4

Figure 12:
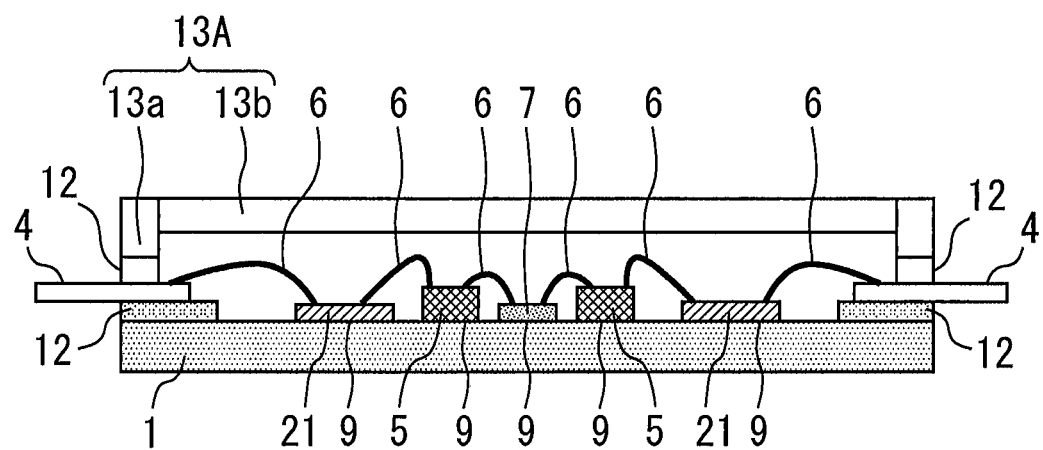
FIG. 12 is a sectional view of a semiconductor device according to Embodiment 4.

FIG. 12 is a sectional view of a semiconductor device according to Embodiment 4. A lead 4 is fixed to a heat sink 1 with an insulating adhesive 12. The lead 4 and the heat sink 1 can be electrically isolated by using the insulating adhesive 12. An outer matching substrate 21, a matching substrate 5, and a semiconductor chip 7 are fixed to the heat sink 1. A solder 9 such as a gold-tin eutectic solder, for example, is made use of in fixing those constituent elements.

A cover 13A is fixed to an upper surface of the lead 4 with an insulating adhesive 12. Functionally speaking, the cover 13A has an integral function of a frame portion 13a and a cap portion 13b. The frame portion 13a is an annular portion fixed to the upper surface of the lead 4 with the insulating adhesive 12. The cap portion 13b is a portion fixed to an upper surface of the frame portion 13a. By using a plurality of wires 6, the lead 4 and an outer matching substrate 21 are connected, the outer matching substrate 21 and a matching substrate 5 are connected, and the matching substrate 5 and a semiconductor chip 7 are connected electrically.

Figure 13:
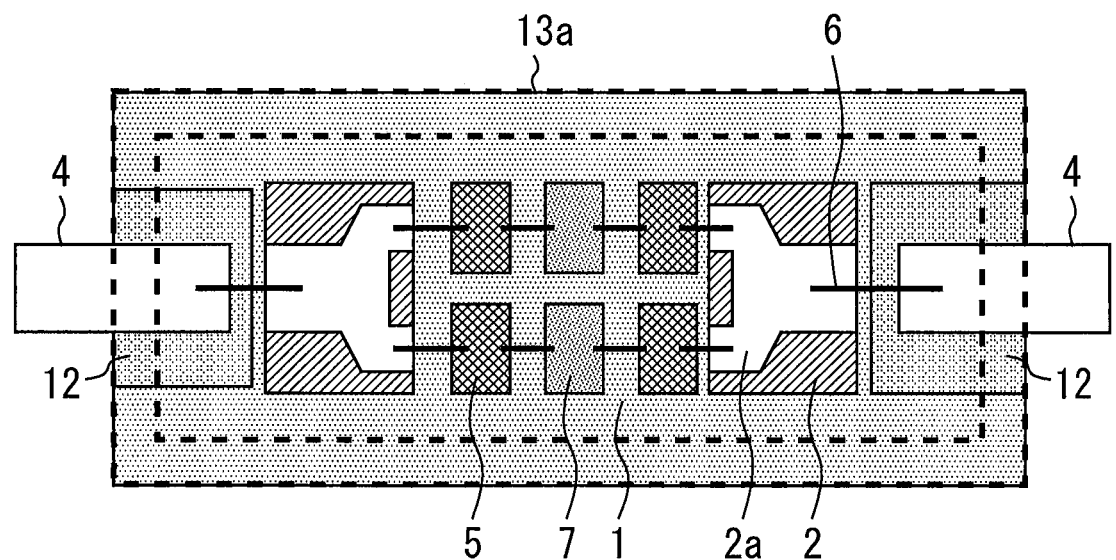
FIG. 13 is a plan view of the semiconductor device.

FIG. 13 is a plan view of the semiconductor device according to Embodiment 4. A broken line constitutes an outline of the frame portion 13a of the cover 13A. The frame portion 13a is in contact with the upper surface of the lead 4. The frame portion 13a is in contact with the insulating adhesive 12 with which the lead 4 is joined. The frame portion 13a is also in contact with the heat sink 1 at a portion where no lead 4 and insulating adhesive 12 are present. The frame portion 13a is formed along an outer edge of the heat sink 1. In other words, the outer edge of the frame portion 13a is made to coincide with an outer edge of the heat sink 1 in a plan view. This is made possible by joining the frame portion 13a to the lead 4. Consequently, when compared with a case where the frame 3 is provided inwards of the lead 4 as in Embodiment 1, an area surrounded by the frame can be increased. This enables a high-density mounting on the heat sink 1. For example, a gain can be increased by increasing the size of a semiconductor chip 7 while maintaining the size of a semiconductor device.

When mounting the lead 4 on a ceramic component such as a ceramic terminal, for example, it is considered that the ceramic component fails as a result of being damaged by the lead 4. In Embodiment 4 of the present invention, however, since the wire is connected directly to the lead 4 while the lead 4 is fixed to the heat sink 1, a ceramic terminal which is easy to crack can be omitted.

Figure 14:
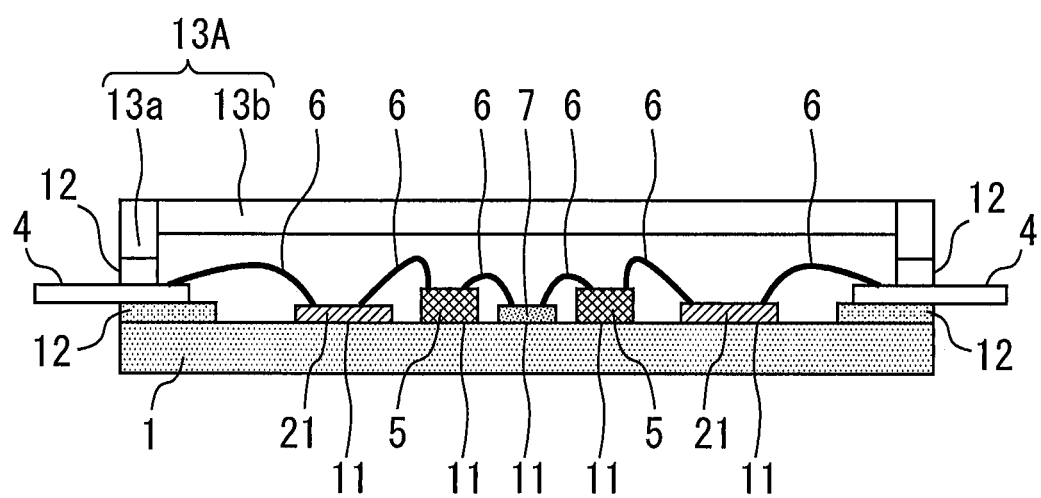
FIG. 14 is a sectional view of a semiconductor device according to a modified example.

FIG. 14 is a sectional view of a semiconductor device according to a modified example. An outer matching substrate 21, a matching substrate 5 and a semiconductor chip 7 are fixed to a heat sink 1 with silver sintered materials 11. Since the silver sintered material 11 has a high fusion point, by joining the outer matching substrate 21, the matching substrate 5 and the semiconductor chip 7 with the silver sintered materials 11, the silver sintered materials 11 can be prevented from being fused again in a process following the joining of the constituent elements.

Embodiment 5

Figure 15:
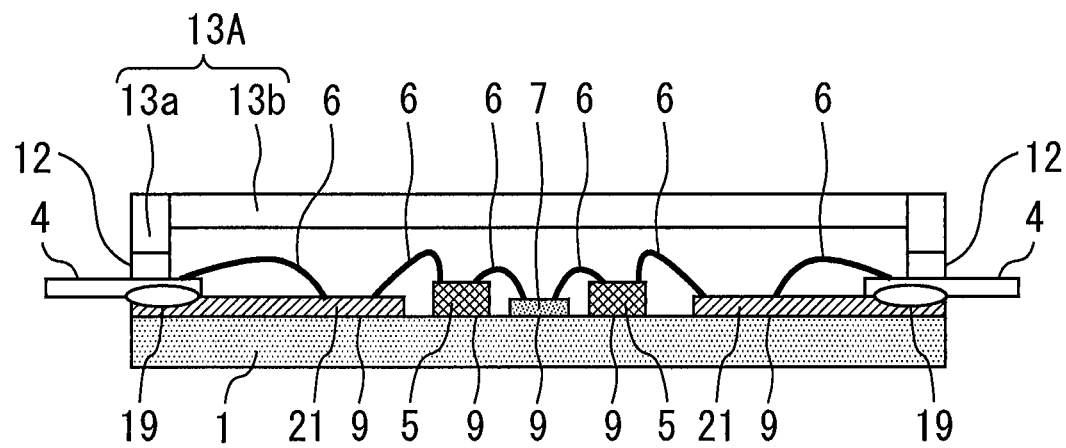
FIG. 15 is a sectional view of a semiconductor device according to Embodiment 5.

FIG. 15 is a sectional view of a semiconductor device according to Embodiment 5. An outer matching substrate 21 has a dielectric which is not ceramic, a metallic film formed on a lower surface of the dielectric, and a metallic pattern formed on an upper surface of the dielectric. A lead 4 is fixed to a heat sink 1 via the outer matching substrate 21. More specifically, the lead 4 is connected to the outer matching substrate 21 with a conductive adhesive 19. The outer matching substrate 21, a matching substrate 5 and a semiconductor chip 7 are fixed to the heat sink 1 with solders 9 such as a gold-tin eutectic solder.

Figure 16:
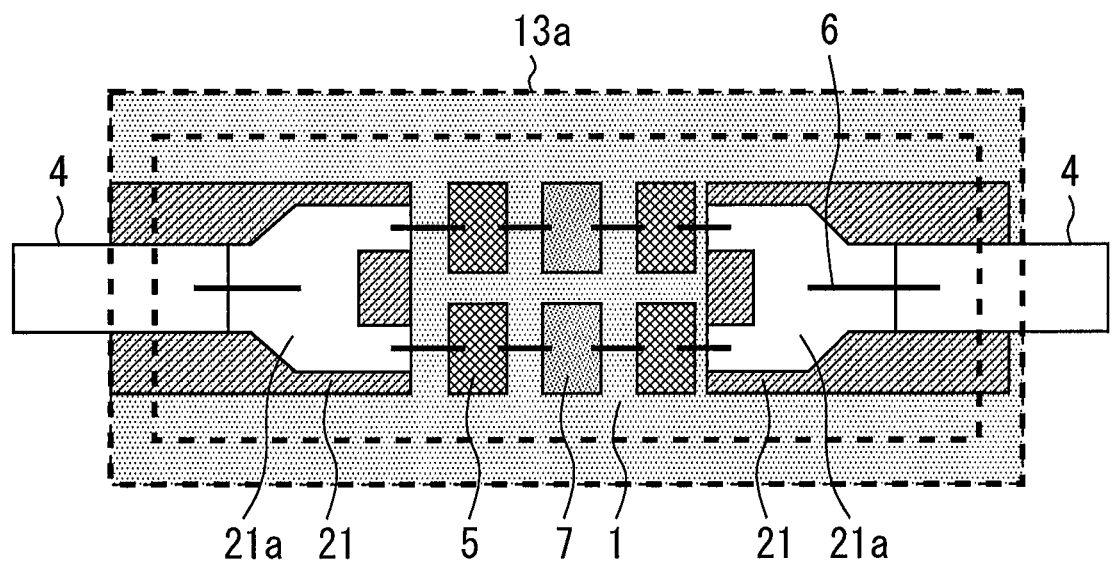
FIG. 16 is a plan view of the semiconductor device.

FIG. 16 is a plan view of the semiconductor device illustrated in FIG. 15. An outline of a frame portion 13a of a cover 13A is indicated by a broken line. A metallic pattern 21a of the outer matching substrate 21 and the lead 4 are connected by a wire 6. The frame portion 13a of the cover 13A is fixed to an upper surface of the lead 4, an upper surface of the outer matching substrate 21, and an upper surface of the heat sink 1. An insulating adhesive can be used for these fixing. According to this semiconductor device, a ceramic terminal which is easy to crack can be omitted by connecting the wire 6 directly to the lead 4.

Figure 17:
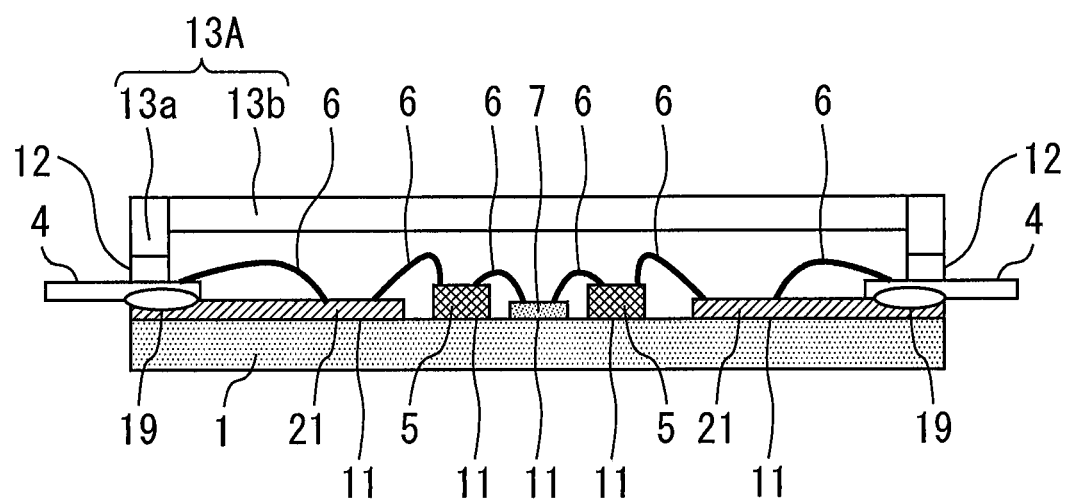
FIG. 17 is a sectional view of a semiconductor device according to a modified example.

FIG. 17 is a sectional view of a semiconductor device according to a modified example. The semiconductor device illustrated in FIG. 17 is such that the solders 9 in FIG. 15 are replaced by the silver sintered materials 11. Since the silver sintered material 11 has a high fusion point, the silver sintered material 11 can be prevented from being fused again after the semiconductor chip 7 and the like are fixed.

Embodiment 6

Figure 18:
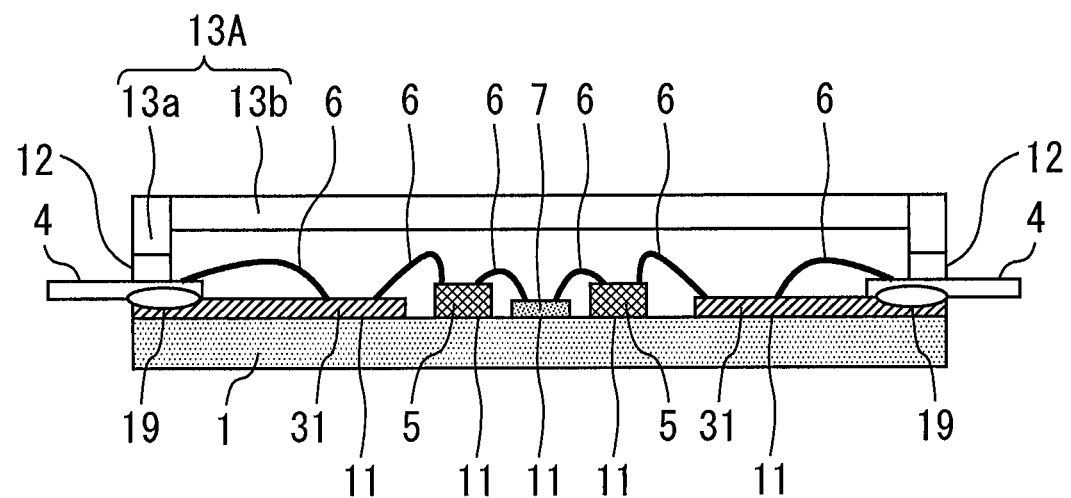
FIG. 18 is a sectional view of a semiconductor device according to Embodiment 6.
Figure 19:
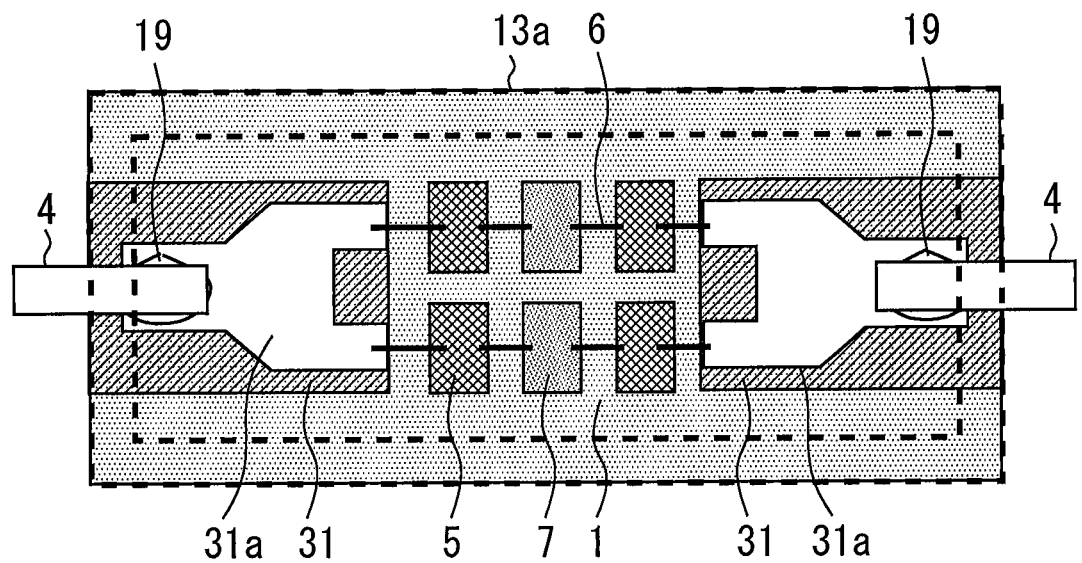
FIG. 19 is a plan view of the semiconductor device.

FIG. 18 is a sectional view of a semiconductor device according to Embodiment 6. An outer matching substrate 31 of this semiconductor device is formed of a flexible printed circuit board. That is, the outer matching substrate 31 includes a flexible substrate formed of an elastic material, a metallic pattern formed on an upper surface of the flexible substrate, and a rear surface metal formed on a rear surface of the flexible substrate. FIG. 19 is a plan view of the semiconductor device in FIG. 18. A metallic pattern 31a of the outer matching substrate 31 is illustrated in FIG. 19. A lead 4 is joined on to the metallic pattern 31a with a conductive adhesive 19 at room temperatures. A frame portion 13a of a cover 13A is bonded to an upper surface of the lead 4 or the like with an insulating adhesive 12.

Returning to the description of FIG. 18, an outer matching substrate 21, a matching substrate 5 and a semiconductor chip 7 are joined to a heat sink 1 with silver sintered materials 11. A solder may be used for this joining. Stress is generated in the outer matching substrate 31 due to a difference in thermal expansion coefficient between the outer matching substrate 31 and the heat sink 1. However, a crack, which would otherwise be generated in the outer matching substrate 31 due to the stress, can be prevented by forming the outer matching substrate 31 of the flexible printed circuit board formed of the elastic material.

A rear surface metal of a ground potential can be extended to an upper surface side by forming a through hole in the printed circuit board constituting the outer matching substrate 31. This can prevent an oscillation of a transmission line.

Figure 20:
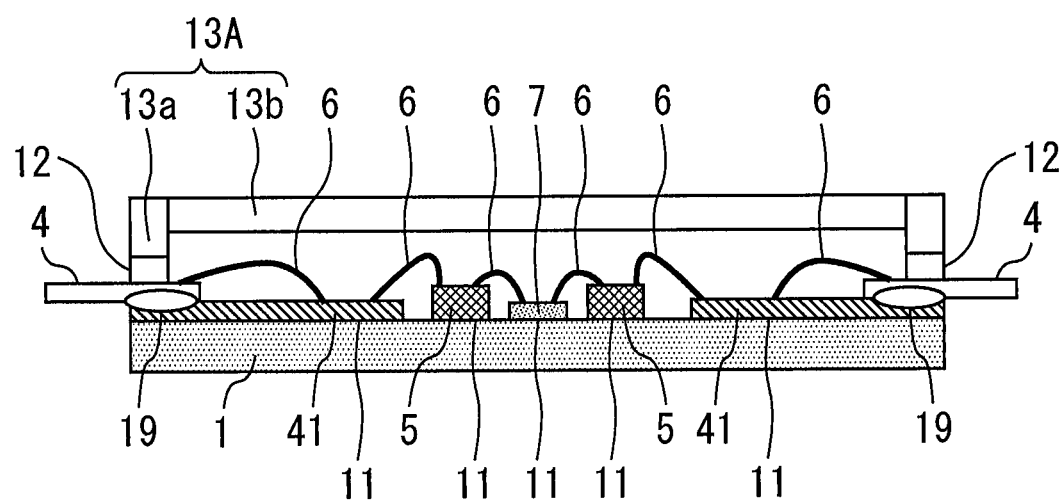
FIG. 20 is a sectional view of a semiconductor device according to a modified example.

FIG. 20 is a sectional view of a semiconductor device according to a modified example. An outer matching substrate 41 is a polyimide circuit board. The polyimide circuit board has a polyimide sheet and copper sheet circuits formed individually on both surfaces of the polyimide sheet. Since the polyimide circuit board is formed of an elastic material, the same working effect can be obtained as that provided when the outer matching substrate is formed of the flexible printed circuit board.

The advantageous effects of the present invention may be enhanced by combining the characteristics of the semiconductor devices according to the embodiments that have been described heretofore.

DESCRIPTION OF SYMBOLS 1 heat sink, 2 integrated component, 3 frame, 4 lead, 5 matching substrate, 6 wire, 7 semiconductor chip

The invention claimed is:

1. A semiconductor device, comprising:
a heat sink having a quadrangular shape in a plan view and having a first portion of an H shape in a plan view and a second portion formed thinner than the first portion;
a substrate having a microstrip line and fixed to the second portion with a solder;
a lead fixed to the substrate;
a matching substrate fixed to the second portion;
a semiconductor chip fixed to the first portion;
a plurality of wires configured to connect the substrate and the matching substrate and to connect electrically the matching substrate and the semiconductor chip; and
a frame whose bottom surface is fixed to the substrate and the first portion and configured to surround the semiconductor chip,
wherein an upper surface of the substrate and an upper surface of the first portion are disposed at a same height relative to a bottom surface of the heat sink, and
wherein the bottom surface of the frame constitutes a flat surface.

2. The semiconductor device according to claim 1, wherein the substrate constitutes an integrated component in which a ceramic terminal having a microstrip line and a matching circuit are integrated into one unit.

3. The semiconductor device according to claim 1, wherein the semiconductor chip is fixed to the first portion with a silver sintered material, and
wherein the substrate is fixed to the second portion with a gold-tin eutectic solder.

4. A semiconductor device, comprising:
a heat sink having a quadrangular shape in a plan view and having a first portion of an H shape in a plan view and a second portion formed thinner than the first portion;
a substrate having a microstrip line and fixed to the second portion with a solder;
a lead fixed to the substrate;
a matching substrate fixed to the second portion;
a semiconductor chip fixed to the first portion;
a plurality of wires configured to connect the substrate and the matching substrate and to connect electrically the matching substrate and the semiconductor chip; and
a frame whose bottom surface is fixed to the substrate and the first portion and configured to surround the semiconductor chip,
wherein an upper surface of the substrate and an upper surface of the first portion are equal in height,
wherein the bottom surface of the frame constitutes a flat surface, and
wherein the substrate constitutes an integrated component in which a ceramic terminal having a microstrip line and a matching circuit are integrated into one unit.

5. A semiconductor device, comprising:
a heat sink having a quadrangular shape in a plan view and having a first portion of an H shape in a plan view and a second portion formed thinner than the first portion;
a substrate having a microstrip line and fixed to the second portion with a solder;
a lead fixed to the substrate;
a matching substrate fixed to the second portion;
a semiconductor chip fixed to the first portion;
a plurality of wires configured to connect the substrate and the matching substrate and to connect electrically the matching substrate and the semiconductor chip; and
a frame whose bottom surface is fixed to the substrate and the first portion and configured to surround the semiconductor chip,
wherein an upper surface of the substrate and an upper surface of the first portion are equal in height,
wherein the bottom surface of the frame constitutes a flat surface,
wherein the semiconductor chip is fixed to the first portion with a silver sintered material, and
wherein the substrate is fixed to the second portion with a gold-tin eutectic solder.

* * * * *